United States Patent
Kumar Vankayala et al.

(10) Patent No.: US 11,769,079 B2
(45) Date of Patent: Sep. 26, 2023

(54) METHOD AND DEVICE FOR DECODING DATA

(71) Applicant: Samsung Electronics Co., Ltd., Suwon-si (KR)

(72) Inventors: Satya Kumar Vankayala, Bangalore (IN); Sukhmeet Singh, Bangalore (IN); Swaraj Kumar, Bangalore (IN); Seungil Yoon, Suwon-si (KR); Issaac Kommineni, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/729,628

(22) Filed: Apr. 26, 2022

(65) Prior Publication Data

US 2022/0368355 A1 Nov. 17, 2022

(30) Foreign Application Priority Data

Apr. 30, 2021 (IN) .............................. 202141019930
May 28, 2021 (IN) .............................. 202141023916

(51) Int. Cl.
| | |
|---|---|
| *G06N 20/00* | (2019.01) |
| *H04W 28/02* | (2009.01) |
| *H04L 1/00* | (2006.01) |
| *H03M 13/29* | (2006.01) |
| *H03M 13/27* | (2006.01) |

(52) U.S. Cl.
CPC ........ *G06N 20/00* (2019.01); *H03M 13/2963* (2013.01); *H04L 1/0009* (2013.01); *H04W 28/0268* (2013.01); *H03M 13/2703* (2013.01); *H03M 13/2987* (2013.01)

(58) Field of Classification Search
CPC .. G06N 20/00; H04W 28/0268; H04L 1/0009
See application file for complete search history.

(56) References Cited

U.S. PATENT DOCUMENTS

| | | | |
|---|---|---|---|
| 2006/0259159 A1* | 11/2006 | Zielinski | ................. H04L 1/005 700/20 |
| 2013/0318017 A1* | 11/2013 | Berrou | ..................... G06N 3/08 706/16 |
| 2018/0314941 A1 | 11/2018 | Lie et al. | |
| 2020/0244501 A1* | 7/2020 | Shattil | ................. H04L 27/2627 |

(Continued)

FOREIGN PATENT DOCUMENTS

| | | |
|---|---|---|
| CN | 110869946 A | 3/2020 |
| EP | 3 761 237 A1 | 1/2021 |
| WO | 2021/001041 A1 | 1/2021 |

OTHER PUBLICATIONS

Indian Office Action dated Jan. 10, 2023, issued in Indian Application No. 202141019930.

*Primary Examiner* — Joseph D Torres
(74) *Attorney, Agent, or Firm* — Jefferson IP Law, LLP (57) ABSTRACT

A method for decoding data by an electronic device is provided. The method includes receiving, by the electronic device, encoded data, determining, by the electronic device, a sparsity of a plurality of Machine Learning (ML) models of a turbo decoder of the electronic device for decoding the encoded data based on Quality-of-Service (QoS) parameters, and decoding, by the electronic device, the encoded data using the turbo decoder based on the determined sparsity.

13 Claims, 7 Drawing Sheets

(56) References Cited

U.S. PATENT DOCUMENTS

| | | | |
|---|---|---|---|
| 2020/0389188 A1* | 12/2020 | Belzer | H03M 13/2957 |
| 2022/0231701 A1* | 7/2022 | Furtek | H03M 13/616 |
| 2022/0247605 A1 | 8/2022 | Rekaya et al. | |
| 2022/0329359 A1 | 10/2022 | Korpi et al. | |

* cited by examiner

METHOD AND DEVICE FOR DECODING DATA

FIELD OF INVENTION

The present disclosure relates to an electronic device, and more specifically to a method and a device for decoding data. The present application is based on and claims priority from an Indian Provisional Application Number 202141019930 filed on 30 Apr. 2021 and 202141023916 filed on 28 May 2021, the disclosure of which is hereby incorporated by reference herein

BACKGROUND

Figure 1:
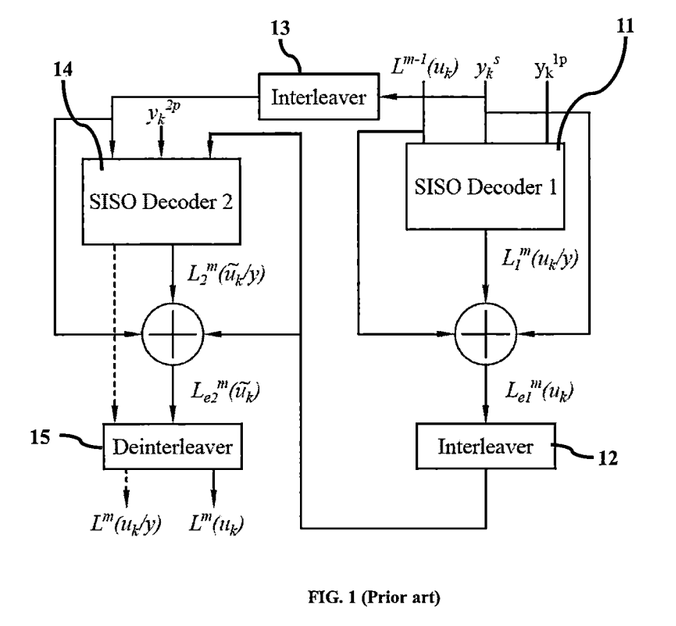
FIG. 1 is an architectural diagram of a conventional turbo decoder, according to a prior art.

Generally a base station comprises a demapper for decoding binary data, where speed of the decoding can be increased using components such as Graphics Processing Units (GPUs). A conventional turbo decoder of the demapper is a crucial component in decoding the binary data. FIG. 1 is an architectural diagram of a conventional turbo decoder. The turbo decoder decodes the binary data using two soft-in soft-out (SISO) decoders (11, 14), two interleavers (12, 13) and a deinterleaver (14). Computational complexity for decoding the binary data is high in the conventional turbo decoder. Also, the conventional turbo decoder is not suitable for a cloud-based Radio Access Network (RAN) such as Virtual-RAN (VRAN), Open-RAN (ORAN), Centralized-RAN (CRAN) for faster decoding. The decoding should be done within a loss tolerance and delay constraint. Hence, it is desired to decode the binary data based on packet loss tolerance and maximum packet delay constraint for reducing latency, reducing packet delay, and faster decoding of the binary data. Thus, it is desired to provide a solution for faster decoding at the turbo decoder by reducing computational complexity.

OBJECT OF INVENTION

The principal object of the embodiments herein is to provide a method and an electronic device for decoding data. The method can be used for fast-decoding of the data using a Machine Learning (ML) based turbo decoder of the electronic device includes sparse Deep Neural Network (DNN) decoders or Convolutional Neural Network (CNN) decoders, where neural networks of the sparse DNN/CNN decoders determine an optimal Modulation and Coding Scheme (MCS) and packet size. The method can be implemented at the base station with GPU or without GPU for decoding the data.

Another object of the embodiments herein is to implement the method in an application level or a hardware level or a hybrid of the application and hardware levels for faster decoding of the data.

Another object of the embodiments herein is to provide a faster data decoding technique with reduced computationally complexity for cloud-based RANs such as VRAN, ORAN, CRAN, etc. The proposed method requires lesser computational cycles for decoding the data which results in lesser latency.

SUMMARY

Accordingly, the embodiments herein provide a method for decoding encoded data by an electronic device. The method includes receiving, by the electronic device, the encoded data. The method includes determining, by the electronic device, a sparsity of a plurality of ML models of a turbo decoder of the electronic device based on Quality-of-Service (QoS) parameters. The method includes decoding, by the electronic device, the encoded data using the turbo decoder based on the determined sparsity.

In an embodiment, where the QoS parameters including a QoS Class Identifier (QCI), a QoS, a Bandwidth Part (BWP), a Subcarrier Spacing (SCS), a Bandwidth (BW), a coherence BW, a coherence time, an interference, a noise, an operating frequency, a User Equipment (UE) capability, a Multiple-Input And Multiple-Output (MIMO) capability, a transmission mode.

In an embodiment, where the method includes determining, by the electronic device, whether an accuracy of the decoded data from the turbo decoder with respect to real decoded data of the encoded data is greater than a threshold value. The method includes increasing, by the electronic device, the sparsity of the plurality of ML models, in response to determining that the accuracy of the decoded data from the turbo decoder with respect to the real decoded data of the encoded data is greater than the threshold value.

In an embodiment, where determining the sparsity of the plurality of ML models based on the QoS parameters, includes determining, by the electronic device, the QoS parameters including a code word size, a code rate, a Signal to Noise Ratio (SNR), long/short filters, interference, a load of neighboring base station, a sub carrier spacing, and an operating frequency, and predicting, by the electronic device, the sparsity of the plurality of ML models by providing the QoS parameters to a ML model.

In an embodiment, where determining the sparsity of the plurality of ML models based on the QoS parameters, includes assigning, by the electronic device, default weights for each layer of the plurality of ML models and a default sparsity to the plurality of ML models training, by the electronic device, the plurality of ML models in a fully connected mode without removing any connections based on the QoS parameters, updating, by the electronic device, weights of each layer of the plurality of ML models by performing to Stochastic Gradient Descent (SGD) and Stochastic Weight Averaging (SWA) on the default weights, hierarchically training, by the electronic device, the plurality of ML models while incrementally increasing the sparsity of the plurality of ML models, and determining, by the electronic device, the sparsity of the plurality of ML models.

In an embodiment, where hierarchically training, by the electronic device, the plurality of ML models while incrementally increasing the sparsity of the plurality of ML models, includes sorting, by the electronic device, the updated weights of each layer in an increasing order, determining, by the electronic device, whether the updated weights of each layer meet a threshold condition, identifying, by the electronic device, weak connections between layers of the plurality of ML models in response to determining the layers with the updated weights meet the threshold condition, and deleting, by the electronic device, the weak connections between layers of the plurality of ML models for incrementally increasing the sparsity of the plurality of ML models.

Accordingly, the embodiments herein provide a method for increasing the sparsity of the trained ML models of the plurality of turbo decoders. The method includes receiving, by a central electronic device, the weights of each layer of the trained ML models of the plurality of turbo decoders. The method includes determining, by the central electronic device, an average of the weights of each layer of the trained ML models of the plurality of turbo decoders. The method includes updating, by the central electronic device, the weights of each layer of the trained ML models of the plurality of turbo decoders with the average of the weights for increasing the sparsity of the ML models of the plurality of turbo decoder.

Accordingly, the embodiments herein provide the electronic device for decoding the encoded data. The electronic device includes a sparsity controller, a memory, a processor, and a turbo decoder including the plurality of ML models, where the sparsity controller is coupled to the memory and the processor. The sparsity controller is configured for receiving the encoded data. The sparsity controller is configured for determining the sparsity of the plurality of ML models of the turbo decoder based on the QoS parameters. The sparsity controller is configured for decoding the encoded data using the turbo decoder based on the determined sparsity.

Accordingly, the embodiments herein provide the central electronic device for increasing the sparsity of trained ML models of the plurality of turbo decoders. The central electronic device includes a performance analyzer, a federated learning controller a memory, and a processor. A performance analyzer receives the weights of each layer of the trained ML models of the plurality of turbo decoders. The federated learning controller determines the average of the weights of each layer of the trained ML models of the plurality of turbo decoders, and updates the weights of each layer of the trained ML models of the plurality of turbo decoders with the average of the weights for increasing the sparsity of the ML models of the plurality of turbo decoder.

Accordingly, the embodiments herein provide the turbo decoder for decoding encoded data. The turbo decoder includes two interleavers, two ML models with an adjustable sparsity for decoding the encoded data, and a deinterleaver. The first ML model receives the encoded data. The second ML model receives decoded data through the first interleaver from the first ML model, and the encoded data through the second interleaver. The deinterleaver performs a deinterleaving operation on decoded data received from the second ML model.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments, and the embodiments herein include all such modifications.

BRIEF DESCRIPTION OF FIGURES

This method and apparatus are illustrated in the accompanying drawings, throughout which like reference letters indicate corresponding parts in the various figures. The embodiments herein will be better understood from the following description with reference to the drawings, in which.

DETAILED DESCRIPTION OF INVENTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Throughout this disclosure, the terms "ML based turbo decoder" and "turbo decoder" are used interchangeably and mean the same, the terms "sparse DNN/CNN decoders" and "sparse DNNs/CNNs" are used interchangeably and mean the same Accordingly, the embodiments herein provide a method for decoding encoded data by an electronic device. The method includes receiving, by the electronic device, the encoded data. The method includes determining, by the electronic device, a sparsity of a plurality of Machine Learning (ML) models of a turbo decoder of the electronic device based on Quality-of-Service (QoS) parameters. The method includes decoding, by the electronic device, the encoded data using the turbo decoder based on the determined sparsity.

Accordingly, the embodiments herein provide a method for increasing the sparsity of the trained ML models of the plurality of turbo decoders. The method includes receiving, by a central electronic device, the weights of each layer of the trained ML models of the plurality of turbo decoders. The method includes determining, by the central electronic device, an average of the weights of each layer of the trained ML models of the plurality of turbo decoders. The method includes updating, by the central electronic device, the weights of each layer of the trained ML models of the plurality of turbo decoders with the average of the weights for increasing the sparsity of the ML models of the plurality of turbo decoder.

Accordingly, the embodiments herein provide the electronic device for decoding the encoded data. The electronic device includes a sparsity controller, a memory, a processor, and a turbo decoder comprising the plurality of ML models, where the sparsity controller is coupled to the memory and the processor. The sparsity controller is configured for receiving the encoded data. The sparsity controller is configured for determining the sparsity of the plurality of ML models of the turbo decoder based on the QoS parameters. The sparsity controller is configured for decoding the encoded data using the turbo decoder based on the determined sparsity.

Accordingly, the embodiments herein provide the central electronic device for increasing the sparsity of trained ML models of the plurality of turbo decoders. The central electronic device includes a performance analyzer, a federated learning controller a memory, and a processor. A performance analyzer receives the weights of each layer of the trained ML models of the plurality of turbo decoders. The federated learning controller determines the average of the weights of each layer of the trained ML models of the plurality of turbo decoders, and updates the weights of each layer of the trained ML models of the plurality of turbo decoders with the average of the weights for increasing the sparsity of the ML models of the plurality of turbo decoder.

Accordingly, the embodiments herein provide the turbo decoder for decoding encoded data. The turbo decoder comprises two interleavers, two ML models with an adjustable sparsity for decoding the encoded data, and a deinterleaver. The first ML model receives the encoded data. The second ML model receives decoded data through the first interleaver from the first ML model, and the encoded data through the second interleaver. The deinterleaver performs a deinterleaving operation on decoded data from the second ML model.

The proposed method can be used for fast-decoding of data using ML-based turbo decoder includes sparse DNN/CNN decoders, where neural networks of the sparse DNN/CNN decoders determine an optimal MCS and packet size. In an embodiment, separate sparse neural network are provided for each MCS and packet size, where whole packet is decoded at a time (i.e. one user and/or all users at a time). In another embodiment, single neural network is provided for all MCS and all packet sizes.

The ML-based turbo decoder includes simple adder and multiplier circuits in which a nonlinearity is only due to activation functions. In a dense neural network, all nodes in a column can be evaluated in parallel, and hence the activation functions, as well as computation of larger layers can be offloaded to a VRAN assisted with a powerful GPU.

The ML based turbo decoder is computationally efficient due to using only two light neural networks, which is different from other deep learning approaches.

The ML based turbo decoder has adjustable sparsity property, where the sparsity can be varied according to QoS requirements. The computational complexity of the neural network can be reduced by choosing a proper sparsity for the neural networks.

The computational complexity of the turbo decoder is reduced by developing a model-driven DNN/CNN based solution to emulate the performance of a max-log-MAP method, and further by inducing sparsity in the constructed DNN/CNN. The weights in the neural network are updated using SGD and SWA methods, where the SWA method is used for stable upgradation of the weights. Upon optimizing the sparsity, the computational gains are maximized by keeping Bit Error Rate (BER) performance comparable to a benchmark setting.

The ML based turbo decoder has an activation function which is a piece wise defined sigmoid function and optimized for turbo decoding. The proposed activation function is more computationally efficient than a conventional sigmoid function.

The ML based turbo decoder of a central cloud server is used to trained on multiple base stations simultaneously. The ML based turbo decoder is trained in different environment setting at each base station. Further, the central cloud server tunes the turbo decoding neural network over a wide network. Further, the central cloud server leverages the data such as location information of the UEs, usage patterns, etc.

The central cloud server controls the sparsity of each base station which reduces computational requirement at the base station and allow for better QoS requirement settings.

The ML based turbo decoder can also be trained on edge cloud computing, where mobility information can be harnessed while training for the edge cloud computing. The proposed method outperforms conventional methods in terms of BER. The proposed method is scalable with higher order modulation schemes as well.

The proposed method allows the central cloud server for distributed training of the ML models by aggregating the weights from ML models of each base station. Thus, the central cloud server obtains a larger dataset and different environment can be used to train the ML models efficiently, which results in improving an efficacy of the ML models. Using the central cloud server, only one single ML model can be deployed across all the base stations, which brings uniformity and reduces operation and maintenance overheads.

The proposed neural network architecture of the turbo decoder can be trained to emulate the performance of any Log-Likelihood Ratio (LLR)-based iterative decoding method such as the max-log-MAP method or a min-sum method.

Referring now to the drawings, and more particularly to FIGS. 2A through 8, there are shown preferred embodiments.

Figure 2A:
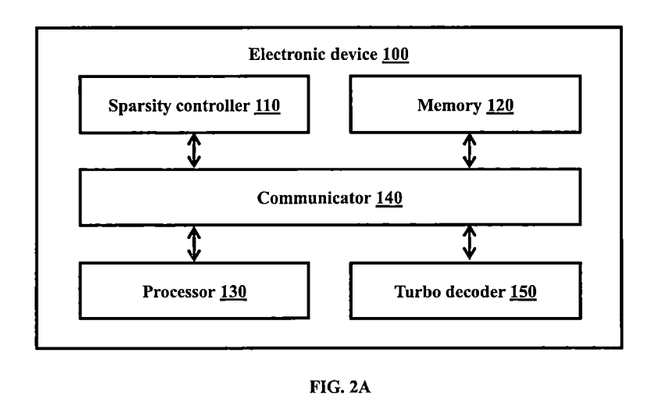
FIG. 2A is a block diagram of an electronic device for decoding encoded data, according to an embodiment as disclosed herein.

FIG. 2A is a block diagram of an electronic device (100) for decoding encoded data, according to an embodiment as disclosed herein. Examples of the electronic device (100) include, but are not limited to a User Equipment (UE), a base station (e.g. eNodeB, gNodeB, ORAN, CRAN, VRAN), etc. In an embodiment, the electronic device (100) includes a sparsity controller (110), a memory (120), a processor (130), a communicator (140), and a turbo decoder (150), where the turbo decoder (150) includes a plurality of Machine Learning (ML) models (e.g. sparse DNN 1 (301), sparse DNN 1 (302)). The sparsity controller (110) is coupled to the memory and the processor. The sparsity controller (110) is implemented by processing circuitry such as logic gates, integrated circuits, microprocessors, microcontrollers, memory circuits, passive electronic components, active electronic components, optical components, hardwired circuits, or the like, and may optionally be driven by a firmware. The circuits may, for example, be embodied in one or more semiconductor chips, or on substrate supports such as printed circuit boards and the like.

The sparsity controller (110) receives the encoded data. The sparsity controller (110) determines the sparsity of the plurality of ML models (301, 302) of the turbo decoder (150) based on QoS parameters. The QoS parameters includes a QoS Class Identifier (QCI), a QoS, a Bandwidth Part (BWP), a Subcarrier Spacing (SCS), a Bandwidth (BW), a coherence BW, a coherence time, an interference, a noise, an operating frequency, a User Equipment (UE) capability, a Multiple-Input And Multiple-Output (MIMO) capability, a transmission mode. The sparsity controller (110) decodes the encoded data using the turbo decoder (150) based on the determined sparsity.

In an embodiment, the sparsity controller (110) determines whether an accuracy of the decoded data from the turbo decoder (150) with respect to real decoded data of the encoded data is greater than a threshold value. The sparsity controller (110) increases the sparsity of the plurality of ML models (301, 302), in response to determining that the accuracy of the decoded data from the turbo decoder (150) with respect to the real decoded data of the encoded data is greater than the threshold value.

In an embodiment, for determining the sparsity of the plurality of ML models (301, 302) based on the QoS parameters, the sparsity controller (110) determines the QoS parameters including a code word size, a code rate, a Signal to Noise Ratio (SNR), long/short filters, interference, a load of neighboring base station, a sub carrier spacing, and an operating frequency. Further, the sparsity controller (110) predicts the sparsity of the plurality of ML models (301, 302) by providing the QoS parameters to a ML model.

In an embodiment, for determining the sparsity of the plurality of ML models (301, 302) based on the QoS parameters, the sparsity controller (110) assigns default weights for each layer of the plurality of ML models (301, 302) and a default sparsity to the plurality of ML models (301, 302). Further, the sparsity controller (110) trains the plurality of ML models (301, 302) in a fully connected mode without removing any connections based on the QoS parameters. Further, the sparsity controller (110) updates the weights of each layer of the plurality of ML models (301, 302) by performing to Stochastic Gradient Descent (SGD) and Stochastic Weight Averaging (SWA) on the default weights. Further, the sparsity controller (110) hierarchically trains the plurality of ML models (301, 302) while incrementally increasing the sparsity of the plurality of ML models (301, 302). Further, the sparsity controller (110) determines the sparsity of the plurality of ML models (301, 302).

Updating the weights (θ) using the SWA provides a stability to the weight updating process, and enables convergence of the proposed operations to a wider optimal solution with a flatter minimum Performing SWA of the weights includes determining a running average of a weight matrix ($θ_m$) once in every fixed number of iterations. If m is the running average, then the update occurs as $$θ_m \leftarrow \frac{(θ_m(i/δ) + θ)}{(i/δ) + 1} \quad (1)$$

where i represents a current iteration number. At the end of k iterations, the value of $θ_m$ equals an average of weights at iterations (δ; 2 δ; . . . ; k δ).

The sparsity controller (110) trains the sparse DNNs/CNNs by updating the weight matrix ($θ_m$) using the SGD. The weight matrix is updated using equation 2, so as to minimize a loss function L using the SGD as follows.

$$θ \leftarrow θ - \tilde{γ}\nabla \mathcal{L} \quad (2)$$

where $$\mathcal{L} = \sum_{i=1}^{N}\sum_{k=1}^{K}(u_k^{(i)}\log(L^M(u_k^{(i)}|y)) + (1 - u_k^{(i)})\log(1 - L^M(u_k^{(i)}|y))),$$

and γ is learning rate.

In an embodiment, for hierarchically training the plurality of ML models (301, 302) while incrementally increasing the sparsity of the plurality of ML models (301, 302), the sparsity controller (110) sorts the updated weights of each layer in an increasing order. Further, the sparsity controller (110) determines whether the updated weights of each layer meet a threshold condition. Further, the sparsity controller (110) identifies weak connections between layers of the plurality of ML models (301, 302) in response to determining the layers with the updated weights meet the threshold condition. Further, the sparsity controller (110) deletes the weak connections between layers of the plurality of ML models (301, 302) for incrementally increasing the sparsity of the plurality of ML models (301, 302).

The sparsity controller (110) intelligently chooses appropriate architecture based on packet delay and packet error tolerance i.e. based on QCI/QoS requirements and application types such as an Enhanced Machine-Type Communication (eMTC) or Narrowband Internet of Things (NB-IoT) or a Long-Term Evolution (LTE) system or a 5th generation cellular system or variable cloud resources. The proposed method can be used in the UE based on a look table. The sparse DNNs/CNNs in the UE load the look table values based on the QoS parameters. All the schemes can be implemented in software or hardware. As an online or offline solution.

The memory (120) stores instructions to be executed by the processor (130). The memory (120) may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory (120) may, in some examples, be considered a non-transitory storage medium. The term "non-transitory" may indicate that the storage medium is not embodied in a carrier wave or a propagated signal. However, the term "non-transitory" should not be interpreted that the memory (120) is non-movable. In some examples, the memory (120) can be configured to store larger amounts of information than its storage space. In certain examples, a non-transitory storage medium may store data that can, over time, change (e.g., in Random Access Memory (RAM) or cache). The memory (120) can be an internal storage unit or it can be an external storage unit of the electronic device (100), a cloud storage, or any other type of external storage.

The processor (130) is configured to execute instructions stored in the memory (120). The processor (130) may be a general-purpose processor, such as a Central Processing Unit (CPU), an Application Processor (AP), or the like, a graphics-only processing unit such as a Graphics Processing Unit (GPU), a Visual Processing Unit (VPU) and the like. The processor (130) may include multiple cores to execute the instructions. The communicator (140) is configured for communicating internally between hardware components in the electronic device (100). Further, the communicator (140) is configured to facilitate the communication between the electronic device (100) and other devices via one or more networks (e.g. Radio technology). The communicator (140) includes an electronic circuit specific to a standard that enables wired or wireless communication.

Although the FIG. 2A shows the hardware components of the electronic device (100) but it is to be understood that other embodiments are not limited thereon. In other embodiments, the electronic device (100) may include less or a greater number of components. Further, the labels or names of the components are used only for illustrative purpose and does not limit the scope of the invention. One or more components can be combined together to perform same or substantially similar function for decoding the encoded data.

Figure 2B:
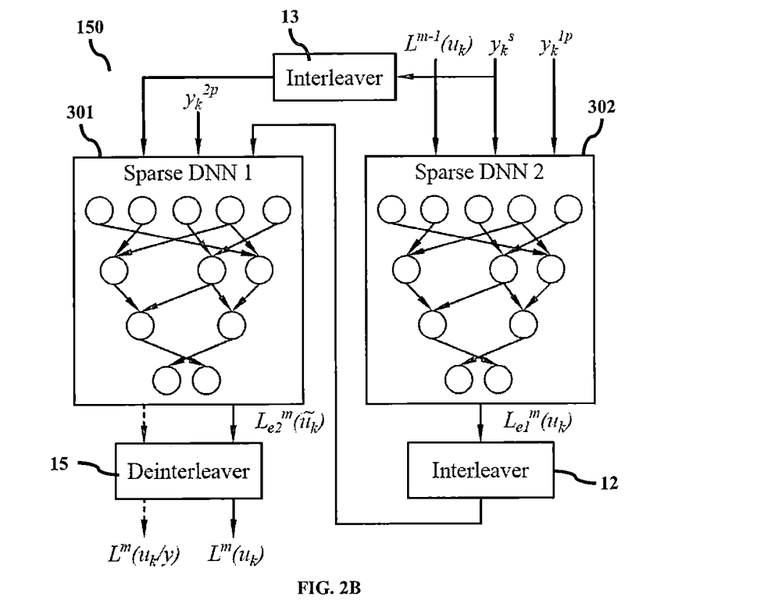
FIG. 2B is a block diagram of a turbo decoder of the electronic device for decoding the encoded data, according to an embodiment as disclosed herein.

FIG. 2B is a block diagram of the turbo decoder (150) of the electronic device (100) for decoding the encoded data, according to an embodiment as disclosed herein. The turbo decoder (150) includes two interleavers (12, 13), the two ML models (301, 302) with an adjustable sparsity for decoding the encoded data, and a deinterleaver (15). The first ML model (302) receives the encoded data and decodes the encoded data. The first interleaver (12) performs the interleaving operation on the decoded data received from the first ML model (302). The second interleaver (13) performs the interleaving operation on the encoded data. The second ML model (301) receives the interleaved decoded data from the first interleaver (12), and the interleaved encoded data from the second interleaver (13), and decodes the received data. Further, the deinterleaver (15) performs a deinterleaving operation on the decoded data received from the second ML model (301).

The turbo decoder (150) consists of simple adder and multiplier circuits, in which a nonlinearity is only due to activation functions. The sparsity controller (110) evaluates all nodes in a column of the sparse DNNs/CNNs in parallel. Hence, the sparsity controller (110) can offload the activation functions as well as the computation of large layers to the VRAN assisted with a powerful GPU. The construction of the sparse DNNs/CNNs includes the performing the SWA of the weights for updating and stability of the weights. Increasing the sparsity provides significant reduction in computations of decoding. Also, number of decoding iterations can be reduced due to an accuracy of the sparse DNNs/CNNs.

In an embodiment, the ML models (301, 302) includes K+3 number of layers, where K is a block length. An activation function of all layers except last layer of the ML models (301, 302) are Relu (f(x)=max(0,x)), where the last layer is a sigmoid activation $$f(x) = \frac{1}{1+e^{-x}}.$$

a piece wise defined version of the sigmoid function f(x) given below is used at the last layer to further reduce the computational complexity of the turbo decoder (150).

$$f(x) = \begin{cases} 0 & \text{for } x \leq -2.6 \\ \frac{x}{5.2} + \frac{1}{2} & \text{for } |x| < 2.6 \\ 1 & \text{for } x \geq 2.6 \end{cases}$$

The piece-wise approximated activation function reduces the computational complexity of the ML models (301, 302). The approximated function is used in both hidden and output layers of the ML models (301, 302).

N denotes number of training samples of the encoded turbo codes (i.e. encoded data), k denotes the block length of the turbo code in each training sample, $u_{(i)}^k$ denotes the $k^{th}$ message bit at the input for the $i^{th}$ training sample, and $L^M(u_{(i)}^k|y)$ is a-posteriori probability LLRs at end of M iterations. The loss function of the ML models (301, 302) thus measures a cross entropy between an original message bit and a probability of decoding an output as an original message bit over all training samples.

At least one of plurality of modules of the turbo decoder (150) may be implemented through the ML models (301, 302). A function associated with the ML models (301, 302) may be performed through the non-volatile/volatile memory (120), and the processor (130). One or a plurality of processors (130) controls the processing of the input data in accordance with a predefined operating rule or the ML models (301, 302) stored in the non-volatile/volatile memory (120). The predefined operating rules or the ML models (301, 302) are provided through training or learning. Here, being provided through learning means that, by applying a learning method to a plurality of learning data, the predefined operating rule or the ML models (301, 302) of a desired characteristic is made. The learning may be performed in the electronic device (100) itself in which the ML models (301, 302) according to an embodiment is performed, and/or may be implemented through a separate server/system.

The ML models (301, 302) may consist of a plurality of neural network layers. Each layer has a plurality of weight values, and performs a layer operation through calculation of a previous layer and an operation of a plurality of weights. Examples of neural networks include, but are not limited to, Convolutional Neural Network (CNN), Deep Neural Network (DNN), Recurrent Neural Network (RNN), Restricted Boltzmann Machine (RBM), Deep Belief Network (DBN), Bidirectional Recurrent Deep Neural Network (BRDNN), Generative Adversarial Networks (GAN), and deep Q-networks. The learning method is a method for training a predetermined target device (for example, a robot) using a plurality of learning data to cause, allow, or control the target device to make a determination or prediction. Examples of the learning method include, but are not limited to, supervised learning, unsupervised learning, semi-supervised learning, or reinforcement learning.

Although the FIG. 2B shows the hardware components of the turbo decoder (150) but it is to be understood that other embodiments are not limited thereon. In other embodiments, the turbo decoder (150) may include less or a greater number of components. Further, the labels or names of the components are used only for illustrative purpose and does not limit the scope of the invention. One or more components can be combined together to perform same or substantially similar function for decoding the encoded data.

Figure 3:
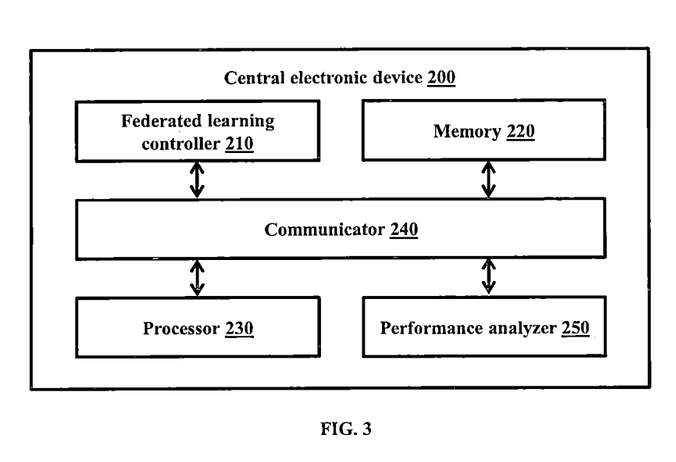
FIG. 3 is a block diagram of a central electronic device for globally updating weights of ML models of turbo decoders, according to an embodiment as disclosed herein.

FIG. 3 is a block diagram of a central electronic device (200) for globally updating the weights of the ML models (301, 302) of the turbo decoders (150a-150c) (refer FIG. 7), according to an embodiment as disclosed herein.

Examples of the central electronic device (200) are a central cloud server, an edge cloud server, etc. In an embodiment, the central electronic device (200) includes a federated learning controller (210), a memory (220), a processor (230), a communicator (240), and a performance analyzer (250). The federated learning controller (210) and the performance analyzer (250) are implemented by processing circuitry such as logic gates, integrated circuits, microprocessors, microcontrollers, memory circuits, passive electronic components, active electronic components, optical components, hardwired circuits, or the like, and may optionally be driven by a firmware. The circuits may, for example, be embodied in one or more semiconductor chips, or on substrate supports such as printed circuit boards and the like.

The performance analyzer (250) receives the weights of each layer of the trained ML models (301, 302) of the turbo decoders (150a-150c). The federated learning controller (210) determines an average of the weights of each layer of the trained ML models (301, 302) of the turbo decoders (150a-150c). The federated learning controller (210) updates the weights of each layer of the trained ML models (301, 302) of the plurality of turbo decoders (150a-150c) with the average of the weights for increasing the sparsity of the ML models (301, 302) of the turbo decoders (150a-150c).

The memory (220) stores the weights of all turbo decoders (150a-150c). The memory (220) stores instructions to be executed by the processor (230). The memory (220) may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory (220) may, in some examples, be considered a non-transitory storage medium. The term "non-transitory" may indicate that the storage medium is not embodied in a carrier wave or a propagated signal. However, the term "non-transitory" should not be interpreted that the memory (220) is non-movable. In some examples, the memory (220) can be configured to store larger amounts of information than its storage space. In certain examples, a non-transitory storage medium may store data that can, over time, change (e.g., in Random Access Memory (RAM) or cache). The memory (220) can be an internal storage unit or it can be an external storage unit of the central electronic device (200), a cloud storage, or any other type of external storage.

The processor (230) is configured to execute instructions stored in the memory (220). The processor (230) may be a general-purpose processor, such as a Central Processing Unit (CPU), an Application Processor (AP), or the like, a graphics-only processing unit such as a Graphics Processing Unit (GPU), a Visual Processing Unit (VPU) and the like. The processor (230) may include multiple cores to execute the instructions. The communicator (240) is configured for communicating internally between hardware components in the central electronic device (200). Further, the communicator (240) is configured to facilitate the communication between the central electronic device (200) and other devices via one or more networks (e.g. Radio technology). The communicator (240) includes an electronic circuit specific to a standard that enables wired or wireless communication.

Although the FIG. 2B shows the hardware components of the central electronic device (200) but it is to be understood that other embodiments are not limited thereon. In other embodiments, the turbo central electronic device (200) may include less or a greater number of components. Further, the labels or names of the components are used only for illustrative purpose and does not limit the scope of the invention. One or more components can be combined together to perform same or substantially similar function for globally updating the weights of the ML models (301, 302) of the turbo decoders (150a-150c).

Figure 4:
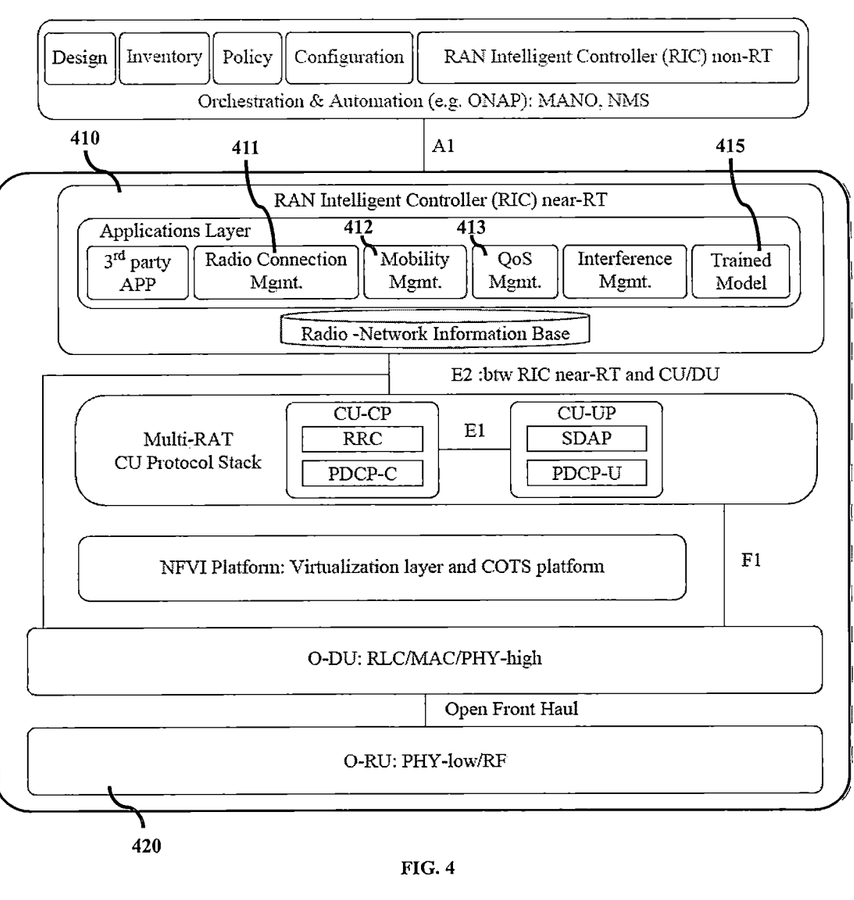
FIG. 4 is an architectural diagram of an ORAN for decoding the encoded data, according to an embodiment as disclosed herein.

FIG. 4 is an architectural diagram of an ORAN for decoding the encoded data, according to an embodiment as disclosed herein. The ORAN includes a RAN Intelligent Controller (RIC) (410). The sparsity controller (110) uses the ML models (301, 302) (e.g. Sparse DNN (SDNN), Sparse CNN (SCNN)) embedded in the RIC (410) of the ORAN for determining the decoded data, whereas the ML models (301, 302) are implemented in a trained model (415) of the RIC (410). The trained model (415) provides feedback of the ML models (301, 302) to a QoS management block (413), a mobility management block (412), and a radio connection management block (411) of the RIC (410).

The turbo decoder (150) can be implemented in the cloud-based RANs (e.g. ORAN, CRAN, VRAN) with or without using a GPU. The turbo decoder (150) decodes the encoded data from multiple devices serially/parallel. The turbo decoder (150) can be implemented using an application architecture and a hardware architecture. For executing the proposed method by using the GPU, the ML models (301, 302) are implemented in O-RU (420) of the ORAN. The sparsity controller (110) provides the decoded data to a physical layer using an E2 interface. A Medium Access Control (MAC) scheduler shares user scheduling details such as resource block information and MCS to a machine or the RIC (410) of the ORAN. Further, the ORAN sends Quadrature Amplitude Modulation (QAM) details along with the allocated grant to the UE.

The ORAN segregates LLR data streams before feeding to the sparse DNNs/CNNs based on the UE's multiple parallel transmissions (for MIMO systems and rank of transmission/PMI). Different streams can have different QAM schemes based on the channel conditions. The ORAN uses a modified swish/Relu function approximated with machine learning, which reduces the computational complexity of decoding. The modified swish/Relu function is also approximated by linear approximation or a linear polynomial approximation with an order of polynomial being $\geq 1$. In the linear approximation, the modified swish/Relu function is approximated with multiple linear functions in the interval of zero to one.

Figure 5:
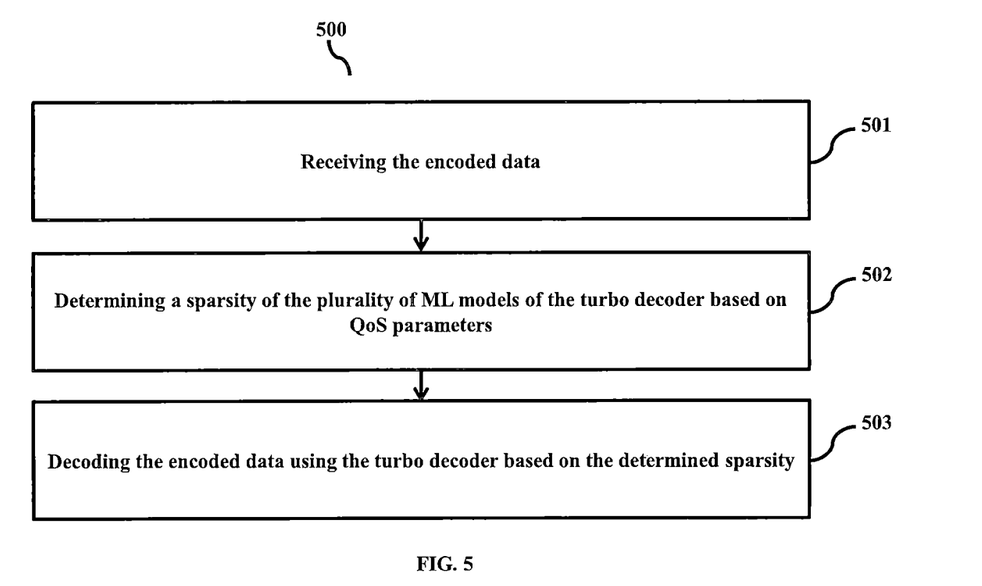
FIG. 5 is a flow diagram illustrating a method for decoding the encoded data, according to an embodiment as disclosed herein.

FIG. 5 is a flow diagram (500) illustrating a method for decoding the encoded data, according to an embodiment as disclosed herein. In an embodiment, the method allows the sparsity controller (110) to perform steps 501-503 of the flow diagram (500). At step 501, the method includes receiving the encoded data. At step 502, the method includes determining the sparsity of the plurality of ML models (301, 302) of the turbo decoder (150) based on the QoS parameters. At step 503, the method includes decoding the encoded data using the turbo decoder (150) based on the determined sparsity.

Figure 6:
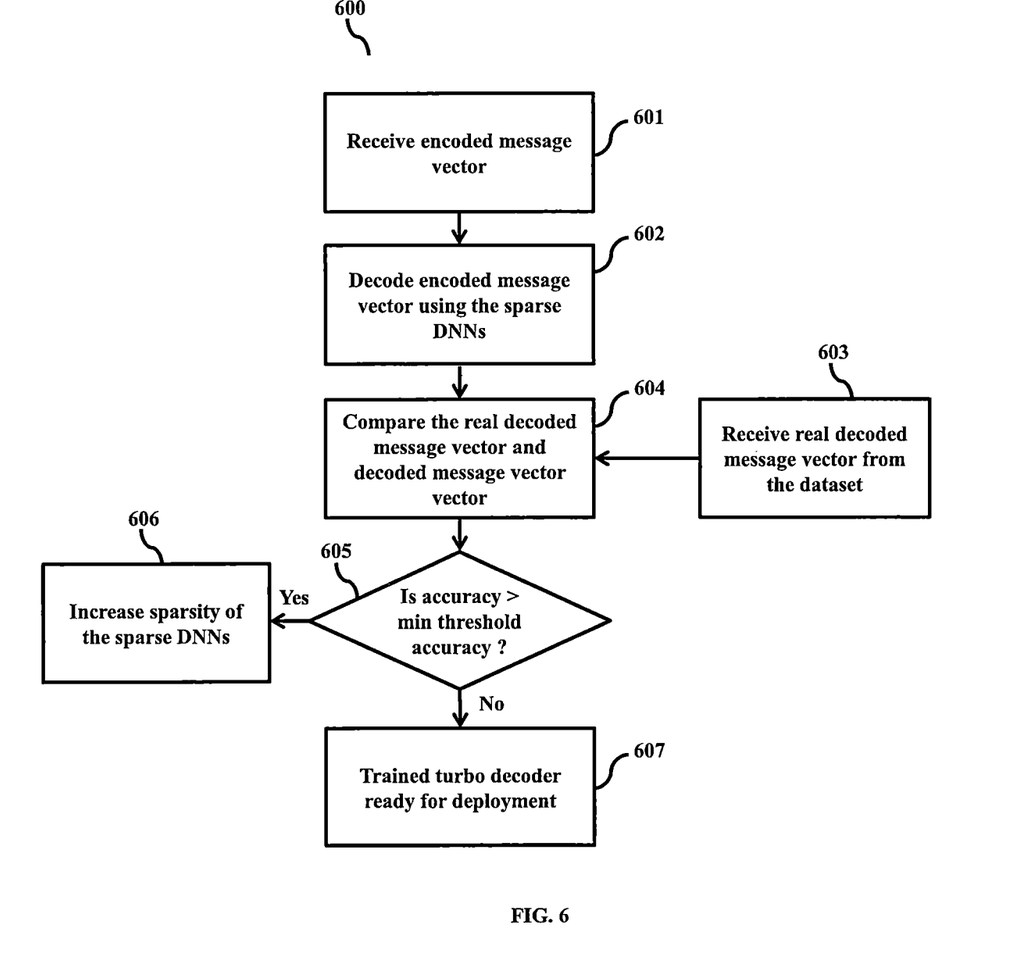
FIG. 6 is a flow diagram illustrating a method for locally adjusting a sparsity of sparse DNN/CNN decoders, according to an embodiment as disclosed herein.

FIG. 6 is a flow diagram (600) illustrating a method for locally adjusting the sparsity of the sparse DNNs/CNNs, according to an embodiment as disclosed herein. In an embodiment, the method allows the sparsity controller (110) to perform steps 601-607 of the flow diagram (600). At step 601, the method includes receiving the encoded message vector (i.e. encoded data). At 602, the method includes decoding the encoded message vector using the sparse DNNs/CNNs. At 603, the method includes receiving a real decoded message vector (i.e. real decoded data) from a dataset. At 604, the method includes checking the accuracy of the decoded message vector by comparing the decoded message vector with the real decoded message vector. At 605, the method includes determining whether the accuracy is greater than a threshold accuracy. At 606, the method includes increasing the sparsity of the sparse DNNs/CNNs upon determining that the accuracy is greater than the threshold accuracy. At 607, the method includes deploying the sparse DNNs/CNNs for decoding upon determining that the accuracy is not greater than the threshold accuracy.

For increasing the sparsity of the sparse DNNs, the sparsity controller (110) trains the ML models (301, 302) in fully connected mode without removing any connections. Further, the sparsity controller (110) updates the weights according to the SGD in and the SWA after the training. Further, the sparsity controller (110) hierarchically trains the ML models (301, 302) for incrementally increasing the sparsity of the ML models (301, 302). In an embodiment, the sparsity controller (110) sets a weight matrix $W_S$ for new sparsity value using the weights of the previously trained model on reduced sparsity. Further, the sparsity controller (110) sorts the weights in each layer in the increasing order, and remove weak connections. cc fixes as the lowest $S^{th}$ percentage weight in $W_S$. For all weights less than a minimum threshold for the weights, the sparsity controller (110) fixes a mask to zero, where the minimum threshold is a minimum value of a weight below which a neuron of the ML models (301, 302) is made inactive by assigning a value of zero. Further, the sparsity controller (110) checks column wise and row wise sparsity of the weight matrix and removes the columns and rows from the weight matrix whose sparsity is higher than the column sparsity threshold ($\Phi$) and the row sparsity threshold ($\beta$).

The sparsity controller (110) removes the columns having higher number of zeroes than the column sparsity threshold ($\Phi$). The weights of the c are saved in a matrix of size m×n, where m and n denote a number of nodes in a previous layer and a next layer of the ML models (301, 302) respectively. So a node from the previous layer is removed upon removing the column having a greater sparsity than the column sparsity threshold ($\Phi$), and the dimension of the weight matrix $W_S$ becomes (m−1)×n. Similarly, the sparsity controller (110) checks the rows of the weight matrix $W_S$ and removes the rows which are sparser than the row sparsity threshold ($\beta$), where the resultant dimension of $W_S$ is m×(n−1). Removing both highly sparse columns and rows from the hidden weight matrix allows the sparsity controller (110) to compress the ML models (301, 302). Such a structured process of compressing the hidden layers reduces the computational complexity of the turbo decoder (150). Further, the sparsity controller (110) updates the QoS parameters and applies the SWA on weights to update Wm.

The sparsity controller (110) optimizes the activation function of the ML models (301, 302) by defining it piecewise and arrived at the number (e.g. x=|2.6|) after a mathematical optimization. The sparsity controller (110) uses the tuned sigmoid function to improve other previous ML models as well, especially the RNN models as each RNN unit has more than 4 sigmoid function calls, which leads to significant improvement in performance. The sparsity controller (110) calls the sigmoid function only once in the last layer of the ML models (301, 302), where all other layers use Relu activation function that require less computational than the sigmoid function.

The various actions, acts, blocks, steps, or the like in the flow diagram (500, 600) may be performed in the order presented, in a different order, or simultaneously. Further, in some embodiments, some of the actions, acts, blocks, steps, or the like may be omitted, added, modified, skipped, or the like without departing from the scope of the invention.

Figure 7:
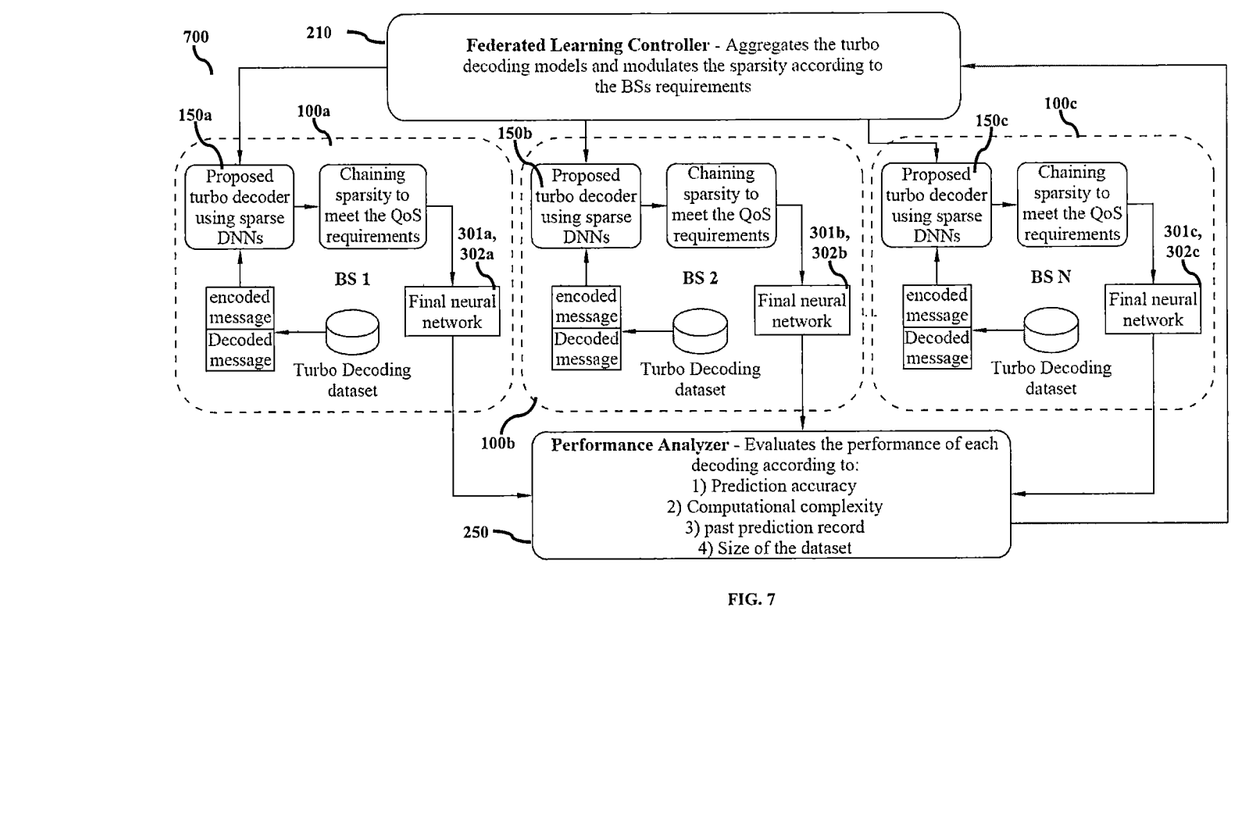
FIG. 7 is a flow diagram illustrating a method for globally adjusting the sparsity of the ML models of the turbo decoders, according to an embodiment as disclosed herein.

FIG. 7 is a flow diagram (700) illustrating a method for globally adjusting the sparsity of the ML models (301*a*, 302*a*, 301*b*, 302*b*, 301*c*, 302*c*) of the turbo decoders (150*a*-150*c*), according to an embodiment as disclosed herein. All base stations (100*a*-100*c*) are connected to the central electronic device (200). The performance analyzer (250) of the central electronic device (200) receives the weights of each layer of the trained ML models (301*a*, 302*a*, 301*b*, 302*b*, 301*c*, 302*c*) of the turbo decoders (150*a*-150*c*) of all base stations (100*a*-100*c*). Further, the performance analyzer (250) evaluates the performance of each turbo decoder (150*a*-150*c*) based on a prediction accuracy, computational complexity, past prediction record, size of the dataset. The federated learning controller (210) determines the average of the weights of each layer of the trained ML models (301*a*, 302*a*, 301*b*, 302*b*, 301*c*, 302*c*) of the turbo decoders (150*a*-150*c*). The federated learning controller (210) updates the weights of each layer of the trained ML models (301*a*, 302*a*, 301*b*, 302*b*, 301*c*, 302*c*) of the turbo decoder (150*a*-150*c*) with the average of the weights for increasing the sparsity of the ML models (301*a*, 302*a*, 301*b*, 302*b*, 301*c*, 302*c*).

The federated learning controller (210) aggregates the turbo decoding models and modulates the sparsity according to the BSs requirements. The ML models (301*a*, 302*a*, 301*b*, 302*b*, 301*c*, 302*c*) are trained in decentralized and distributed manner, where each BS (100*a*-100*b*) will have a local turbo decoding model. After the local model has been trained for a fixed number of iterations, the learnt weights from all the BSs (100*a*-100*b*) are aggregated and a new weights are assigned to the local neural networks. The new weights reflect the aggregated learning of all the BSs (100*a*-100*b*). This leads to reduction in cost for training the model and also increases the efficacy of the model as it is being trained on a larger data sample. The cycle of local training and weights updating across the BSs (100*a*-100*b*) is repeated until the target accuracy is not reached. Once the training is fished, the trained model is deployed on each BS (100*a*-100*b*).

The central electronic device (200) performs distributed training on the ML models (301*a*, 302*a*, 301*b*, 302*b*, 301*c*, 302*c*) by training the ML models (301*a*, 302*a*, 301*b*, 302*b*, 301*c*, 302*c*) in different environment setting at each base station (100*a*-100*c*). The central electronic device (200)

tunes the turbo decoding neural network over a wide network. The central electronic device (200) leverages the cloud data such as location information of the UEs, usage patterns for performing the distributed training. The central electronic device (200) globally adjusts the sparsity levels of the ML models (301*a*, 302*a*, 301*b*, 302*b*, 301*c*, 302*c*), which reduces computational requirement at the base stations (100*a*-100*c*) and allow for better QoS requirement settings. The central electronic device (200) also trains the ML models (301*a*, 302*a*, 301*b*, 302*b*, 301*c*, 302*c*).

In an embodiment, the weights of the SDNN/SCNN is maintained at the base station on per UE basis, which leverages a parallel computing power of cloud systems. In another embodiment, the weights of the SDNN/SCNN of all base stations are maintained at the central cloud server. The central cloud server contains location information of all base stations. By leveraging this location information, the central cloud server performs federated learning by aggregating the weights of the SDNN/SCNN of all base stations. Learning of the SDNN/SCNN is a function of the QCI, the QoS, bandwidth paths, frequency operation, device category, climate conditions, external events, real time traffic data, RRH/BS capabilities, time, base station identifier, day details, location details, density of a traffic, distribution of the traffic, climate conditions, special occasions and festivals, calendar-based events, vacation details/distribution, UE information includes UE type, UE category, UE monthly package, data type information, measurements, offers in malls/movie release dates, sports/school/office events, 4G/5G/UE capability information, etc. Different QCIs have different packet tolerance and packet hard deadline delays. The central cloud server chooses an optimal sparsity of the SDNN/SCNN based on the learning, which results in faster decoding and lower power consumption at the base stations.

Figure 8:
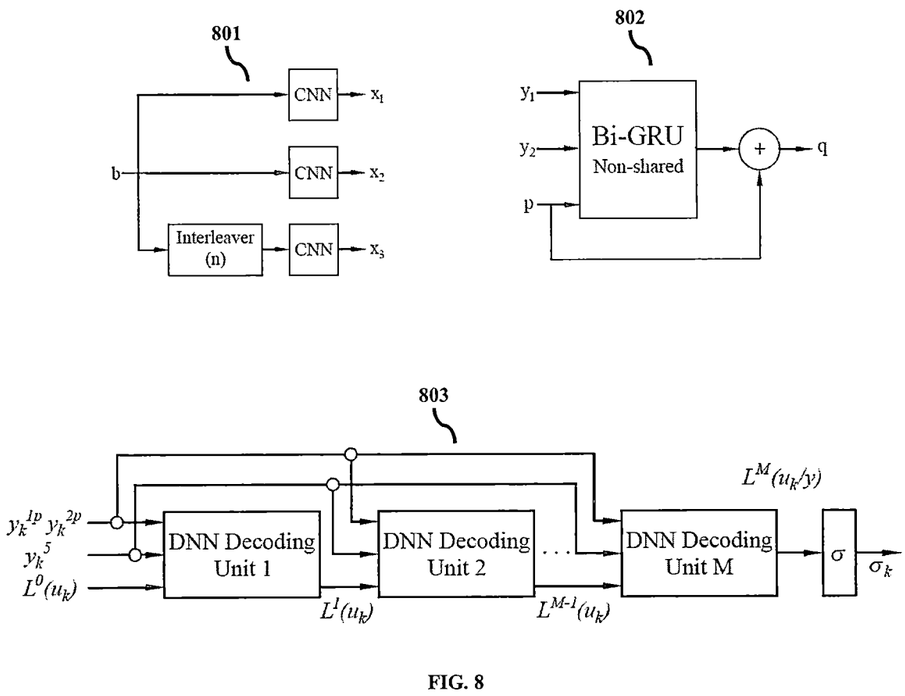
FIG. 8 illustrates schematic diagrams of conventional decoders for comparing with the proposed turbo decoder, according to an embodiment as disclosed herein.

FIG. 8 illustrates schematic diagrams of conventional decoders for comparing with the proposed turbo decoder, according to an embodiment as disclosed herein. Conventional ML based turbo decoder relies on using multiple number of neural networks in the decoding units and using multiples decoding units in an iterative manner. As shown in 801, an existing ML based turbo decoder requires specific hardware accelerators like GPUs at the base stations and multiple number of neural networks such as multiple CNN, DNN and RNNs in the decoding units (801), which increases the computational complexity. As shown in 802, another existing ML based turbo decoder contains 2 Gated Recurrent Units (GRUs) which is a type of RNN which is more computationally complex than the proposed turbo decoder (150), in which each RNN units has 50× computational cost than the DNN. Unlike the conventional ML based turbo decoders, the proposed turbo decoder (150) has 2 sparse DNNs/CNNs which are computationally efficient and the GPUs is not necessary.

As shown in 803, another existing ML based turbo decoder contains cascaded DNN decoding units. The number of decoding units for previous neural networks relies on using same decoding using multiple time, which increases the computational cost. Unlike the conventional ML based turbo decoders, the proposed turbo decoder (150) keeps on increasing the sparsity of decoding unit after each iteration, that leads to reduction in computational cost of the ML models (301, 302).

The embodiments disclosed herein can be implemented using at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the embodiments as described herein.

We claim:

1. A method for decoding data by an electronic device, the method comprises:
   receiving, by the electronic device, encoded data;
   determining, by the electronic device, a sparsity of a plurality of Machine Learning (ML) models for decoding the encoded data based on quality of service (QoS) parameters; and
   decoding, by the electronic device, the encoded data using a turbo decoder based on the determined sparsity.

2. The method of claim 1, wherein the QoS parameters comprise a QoS Class Identifier (QCI), a QoS, a Bandwidth Part (BWP), a Subcarrier Spacing (SCS), a Bandwidth (BW), a coherence BW, a coherence time, an interference, a noise, an operating frequency, a User Equipment (UE) capability, a Multiple-Input Multiple-Output (MIMO) capability, and a transmission mode.

3. The method of claim 1, wherein the method further comprises:
   determining, by the electronic device, whether an accuracy of the decoded data from the turbo decoder with respect to real decoded data of the encoded data is greater than a threshold value; and
   increasing, by the electronic device, the sparsity of the plurality of ML models, in response to determining that the accuracy of the decoded data from the turbo decoder with respect to the real decoded data of the encoded data is greater than the threshold value.

4. The method of claim 3 wherein, increasing the sparsity of trained Machine Learning (ML) models of a plurality of turbo decoders, comprises:
   receiving, by a central electronic device, weights of each layer of the trained ML models of the plurality of turbo decoders;
   determining, by the central electronic device, an average of the weights of each layer of the trained ML models of the plurality of turbo decoders; and
   updating, by the central electronic device, the weights of each layer of the trained ML models of the plurality of turbo decoders with the average of the weights for increasing the sparsity of the ML models of the plurality of decoders.

5. The method of claim 1, wherein determining the sparsity of the plurality of ML models based on the QoS parameters, comprises:
   determining, by the electronic device, the QoS parameters comprising a code word size, a code rate, a Signal to Noise Ratio, long/short filters, interference, a load of neighboring base station, a sub carrier spacing, and an operating frequency; and
   predicting, by the electronic device, the sparsity of the plurality of ML models by providing the QoS parameters to a ML model.

6. The method of claim 1, wherein determining the sparsity of the plurality of ML models based on the QoS parameters, comprises:
- assigning, by the electronic device, default weights for each layer of the plurality of ML models and a default sparsity to the plurality of ML models;
- training, by the electronic device, the plurality of ML models in a fully connected mode without removing any connections based on the QoS parameters;
- updating, by the electronic device, weights of each layer of the plurality of ML models by performing to Stochastic Gradient Descent (SGD) and Stochastic Weight Averaging (SWA) on the default weights;
- hierarchically training, by the electronic device, the plurality of ML models while incrementally increasing the sparsity of the plurality of ML models; and
- determining, by the electronic device, the sparsity of the plurality of ML models.

7. The method of claim 6, wherein hierarchically training, by the electronic device, the plurality of ML models while incrementally increasing the sparsity of the plurality of ML models, comprises:
- sorting, by the electronic device, the updated weights of each layer in an increasing order;
- determining, by the electronic device, whether the updated weights of each layer meet a threshold condition;
- identifying, by the electronic device, weak connections between layers of the plurality of ML models in response to determining the layers with the updated weights meet the threshold condition; and
- deleting, by the electronic device, the weak connections between layers of the plurality of ML models for incrementally increasing the sparsity of the plurality of ML models.

8. An electronic device for decoding data, the electronic device comprising:
- a memory;
- a processor;
- a turbo decoder comprising a plurality of Machine Learning (ML) models; and
- a sparsity controller, coupled to the memory and the processor, the sparsity controller being configured to:
  - receive encoded data,
  - determine a sparsity of the plurality of ML models of the turbo decoder for decoding the encoded data based on quality of service (QoS) parameters, and
  - decode the encoded data using the turbo decoder based on the determined sparsity.

9. The electronic device of claim 8, wherein the QoS parameters comprising a QoS Class Identifier (QCI), a QoS, a Bandwidth Part (BWP), a Subcarrier Spacing (SCS), a Bandwidth (BW), a coherence BW, a coherence time, an interference, a noise, an operating frequency, a User Equipment (UE) capability, a Multiple-Input Multiple-Output (MIMO) capability, and a transmission mode.

10. The electronic device of claim 8, wherein the sparsity controller is further configured to:
- determine whether an accuracy of the decoded data from the turbo decoder with respect to real decoded data of the encoded data is greater than a threshold value; and
- increase the sparsity of the plurality of ML models, in response to determining that the accuracy of the decoded data from the turbo decoder with respect to the real decoded data of the encoded data is greater than the threshold value.

11. The electronic device of claim 8, wherein determining the sparsity of the plurality of ML models based on the QoS parameters, comprises:
- determining the QoS parameters comprising a code word size, a code rate, a Signal to Noise Ratio (SNR), long/short filters, interference, a load of neighboring base station, a sub carrier spacing, and an operating frequency; and
- predicting the sparsity of the plurality of ML models by providing the QoS parameters to a ML model.

12. The electronic device of claim 8, wherein determining the sparsity of the plurality of ML models based on the QoS parameters, comprises:
- assigning default weights for each layer of the plurality of ML models and a default sparsity to the plurality of ML models;
- training the plurality of ML models in a fully connected mode without removing any connections based on the QoS parameters;
- updating weights of each layer of the plurality of ML models by performing to Stochastic Gradient Descent (SGD) and Stochastic Weight Averaging (SWA) on the default weights;
- hierarchically training the plurality of ML models while incrementally increasing the sparsity of the plurality of ML models; and
- determining the sparsity of the plurality of ML models.

13. The electronic device of claim 12, wherein hierarchically training the plurality of ML models while incrementally increasing the sparsity of the plurality of ML models, comprises:
- sorting the updated weights of each layer in an increasing order;
- determining whether the updated weights of each layer meet a threshold condition;
- identifying weak connections between layers of the plurality of ML models in response to determining the layers with the updated weights meet the threshold condition; and
- deleting the weak connections between layers of the plurality of ML models for incrementally increasing the sparsity of the plurality of ML models.

* * * * *